US008927384B2

(12) United States Patent
Kim et al.

(10) Patent No.: US 8,927,384 B2
(45) Date of Patent: Jan. 6, 2015

(54) METHODS OF FABRICATING A SEMICONDUCTOR MEMORY DEVICE

(75) Inventors: Jong-Kyu Kim, Hwaseong-si (KR);
Sangsup Jeong, Suwon-si (KR);
Kukhan Yoon, Hwaseong-si (KR);
Junsoo Lee, Yongin-si (KR); SungIl Cho, Seoul (KR); Yong-Joon Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 320 days.

(21) Appl. No.: 13/400,993

(22) Filed: Feb. 21, 2012

(65) Prior Publication Data
US 2012/0225530 A1 Sep. 6, 2012

(30) Foreign Application Priority Data

Mar. 3, 2011 (KR) .................. 10-2011-0019016

(51) Int. Cl.
*H01L 21/20* (2006.01)
*H01L 27/108* (2006.01)
*H01L 49/02* (2006.01)
*H01L 27/02* (2006.01)
*H01L 21/311* (2006.01)

(52) U.S. Cl.
CPC .......... *H01L 28/91* (2013.01); *H01L 27/10817* (2013.01); *H01L 27/10852* (2013.01); *H01L 27/0203* (2013.01); *H01L 21/31144* (2013.01)
USPC .... 438/381; 438/391; 438/697; 257/E21.021; 257/E21.651

(58) Field of Classification Search
USPC ......... 438/238–239, 240, 244, 391, 399, 387, 438/381, 665, 689, 706, 722, 723, 253, 255, 438/396
See application file for complete search history.

(56) References Cited

U.S. PATENT DOCUMENTS

| 7,459,745 | B2 * | 12/2008 | Lee et al. .................. 257/303 |
| 7,709,342 | B2 * | 5/2010 | Kim et al. .................. 438/391 |
| 7,713,832 | B2 | 5/2010 | Kim |
| 8,124,978 | B2 * | 2/2012 | Kim et al. .................. 257/71 |
| 2007/0004107 | A1 * | 1/2007 | Lee et al. .................. 438/157 |
| 2008/0121609 | A1 * | 5/2008 | Kim et al. .................. 216/6 |
| 2009/0206448 | A1 * | 8/2009 | Cho et al. .................. 257/532 |
| 2010/0240179 | A1 * | 9/2010 | Kim et al. .................. 438/239 |
| 2010/0305266 | A1 * | 12/2010 | Kim et al. .................. 524/588 |
| 2012/0049380 | A1 * | 3/2012 | Kim et al. .................. 257/773 |
| 2012/0104559 | A1 * | 5/2012 | Kim .................. 257/618 |
| 2012/0119383 | A1 * | 5/2012 | Kang et al. .................. 257/774 |
| 2012/0187537 | A1 * | 7/2012 | Hirota .................. 257/532 |
| 2012/0225554 | A1 * | 9/2012 | Yoon et al. .................. 438/675 |

FOREIGN PATENT DOCUMENTS

| KR | 10-2005-0019500 A | 3/2005 |
| KR | 10-2009-0001286 A | 1/2009 |
| KR | 10-2009-0045439 A | 5/2009 |

* cited by examiner

*Primary Examiner* — Savitr Mulpuri
(74) *Attorney, Agent, or Firm* — Lee & Morse, P.C.

(57) ABSTRACT

A method of fabricating a semiconductor memory device includes forming a hard mask pattern using a damascene method on a lower mold layer stacked on a substrate and etching the lower mold layer using the hard mask pattern as an etch mask to define a protrusion under the hard mask pattern. A support pattern is formed on a top surface of the etched lower mold layer, the top surface of the etched lower mold layer being located at a lower level than a top surface of the protrusion. A lower electrode supported by the support pattern is formed.

20 Claims, 25 Drawing Sheets

METHODS OF FABRICATING A SEMICONDUCTOR MEMORY DEVICE

CROSS-REFERENCE TO RELATED APPLICATIONS

Korean Patent Application No. 10-2011-0019016, filed on Mar. 3, 2011, in the Korean Intellectual Property Office, and entitled: "Methods of Fabricating A Semiconductor Memory Device," is incorporated by reference herein in its entirety.

BACKGROUND

1. Field

The present disclosure herein relates to methods of fabricating a semiconductor device.

2. Description of the Related Art

Semiconductor devices are very attractive in the electronics industry because of their small size, multi-functionality and/or low fabrication cost thereof. Semiconductor devices can be categorized as any one of semiconductor memory devices storing logic data, semiconductor logic devices processing operations of logical data, and hybrid semiconductor devices having both the function of the semiconductor memory devices and the function of the semiconductor logic devices. The semiconductor memory devices include dynamic random access memory (DRAM) devices. A unit cell of the DRAM devices has a capacitor storing the logic data.

SUMMARY

According to an embodiment, there is provided a method of fabricating a semiconductor memory device, the method including forming a hard mask pattern using a damascene method on a lower mold layer stacked on a substrate, etching the lower mold layer using the hard mask pattern as an etch mask to form an etched lower mold layer and to define a protrusion under the hard mask pattern, forming a support pattern on a top surface of the etched lower mold layer, the top surface of the etched lower mold layer being located at a lower level than a top surface of the protrusion, and forming a lower electrode supported by the support pattern.

The forming of the hard mask pattern may include forming a guide layer on the lower mold layer, the guide layer having a guide-opening, forming a hard mask layer on the guide layer, the hard mask layer filling the guide-opening, planarizing the hard mask layer to expose the guide layer and to form a hard mask pattern in the guide-opening, and removing the guide layer.

The forming of the support pattern may include forming a support layer on the substrate having the protrusion and planarizing the support layer until the top surface of the protrusion is exposed.

The method may further include removing the hard mask pattern on the protrusion prior to the forming of the support layer.

The forming of the lower electrode may include forming an electrode hole penetrating the lower mold layer and exposing at least a portion of a sidewall of the support pattern, fabricating the lower electrode in the electrode hole, and removing the lower mold layer.

The method may further include forming an upper mold layer on the support pattern and the protrusion prior to formation of the electrode hole. The forming of the electrode hole may include forming the electrode hole to penetrate the upper and lower mold layers and expose at least the portion of a sidewall of the support pattern, and the removing of the lower mold layer may include removing the lower and upper mold layers.

The forming of the electrode hole may include forming a mask layer having at least one hole-opening on the upper mold layer and etching the upper mold layer and the lower mold layer using the mask layer as an etch mask to form the electrode hole. A bottom surface of the hole-opening may overlap with a portion of the top surface of the protrusion.

The mask layer may include a plurality of hole-openings that expose respective portions of the top surface of the protrusion. The forming of the electrode hole may include forming a plurality of electrode holes respectively under the plurality of hole-openings. The fabricating of the lower electrode may include forming a plurality of lower electrodes in the plurality of the electrode holes respectively.

The bottom surface of the hole-opening of the mask layer may overlap with a portion of the support pattern adjacent to the protrusion. The electrode hole may be formed by etching the upper mold layer, the lower mold layer and a portion of the support pattern overlapping the bottom surface of the hole-opening using the mask layer as an etch mask.

The forming of the lower electrode in the electrode hole may include conformably forming a lower electrode layer on the substrate having the electrode hole, forming a filling layer filling the electrode hole on the lower electrode layer, and planarizing the filling layer and the lower electrode layer to form the lower electrode and a filling pattern in the electrode hole. The removing of the lower mold layer may include removing the lower mold layer and the filling pattern.

The method may further include forming a capacitor-dielectric layer on a surface of the lower electrode and forming an upper electrode on the capacitor-dielectric layer.

The protrusion may be formed to have a circle shape, an oval shape, a polygonal shape or a line shape extending in one direction in a plan view.

According to another embodiment, there is provided a method of fabricating a semiconductor memory device, the method including forming a guide layer having a guide-opening on a lower mold layer stacked on a substrate, forming a hard mask layer filling the a guide-opening, and planarizing the hard mask layer to expose the guide layer and to form a hard mask pattern in the guide-opening. The guide layer and the lower mold layer are etched using the hard mask pattern as an etch mask to define a protrusion under the hard mask pattern. The lower mold layer includes the protrusion and an etched top surface located at a lower level than a top surface of the protrusion. A support layer is formed on the substrate having the protrusion. The support layer is planarized until the top surface of the protrusion is exposed, thereby forming a support pattern. A lower electrode is formed to contact the support pattern. The lower electrode is supported by the support pattern.

The forming of the lower electrode may include forming an upper mold layer on the protrusion and the support pattern, forming an electrode hole successively penetrating the upper mold layer and the lower mold layer and exposing at least a portion of a sidewall of the support pattern adjacent to the protrusion, sequentially forming a lower electrode layer and a filling layer on the substrate having the electrode hole, planarizing the filing layer and the lower electrode layer to form a lower electrode and a filling pattern in the electrode hole, and removing the filling pattern, the upper mold layer and the lower mold layer.

According to another embodiment, there is provided a method of fabricating a semiconductor memory device, the method including forming a lower mold layer on a substrate, the lower mold layer including a plurality of spaced apart protrusions, forming a support layer on the substrate having the protrusions, planarizing the support layer until top surfaces of the protrusions are exposed, thereby forming a support pattern between the protrusions, forming an upper mold layer on the protrusions and the support pattern, forming electrode holes successively penetrating the upper mold layer and the lower mold layer and exposing at least a portion of sidewalls of the support pattern adjacent to the protrusions, and forming lower electrodes in the electrode holes.

The plurality of spaced apart protrusions of the lower mold layer may be formed by forming a guide layer having spaced apart guide-openings on the lower mold layer, forming a hard mask layer filling the spaced apart guide-openings, planarizing the hard mask layer until the guide layer is exposed, thereby forming a hard mask pattern in the spaced apart guide-openings, etching the guide layer and the lower mold layer using the hard mask pattern as an etch mask to define the spaced apart protrusions under the hard mask pattern, the lower mold layer including the spaced apart protrusions and an etched top surface located at a lower level than a top surface of the spaced apart protrusions.

The forming of the lower electrodes may include sequentially forming a lower electrode layer and a filling layer on the substrate having the electrode holes, planarizing the filing layer and the lower electrode layer to form lower electrode and filling patterns in the electrode holes, and removing the filling patterns, the upper mold layer and the lower mold layer.

BRIEF DESCRIPTION OF THE DRAWINGS

The above and other features will become more apparent to those of ordinary skill in the art by describing in detail exemplary embodiments with reference to the attached drawings, in which:

FIGS. 1A to 11A illustrate plan views depicting a semiconductor memory device according to an embodiment.

FIGS. 1B to 11B illustrate cross sectional views taken along lines I-I' of FIGS. 1A to 11A, respectively.

DETAILED DESCRIPTION

Figure 1A:
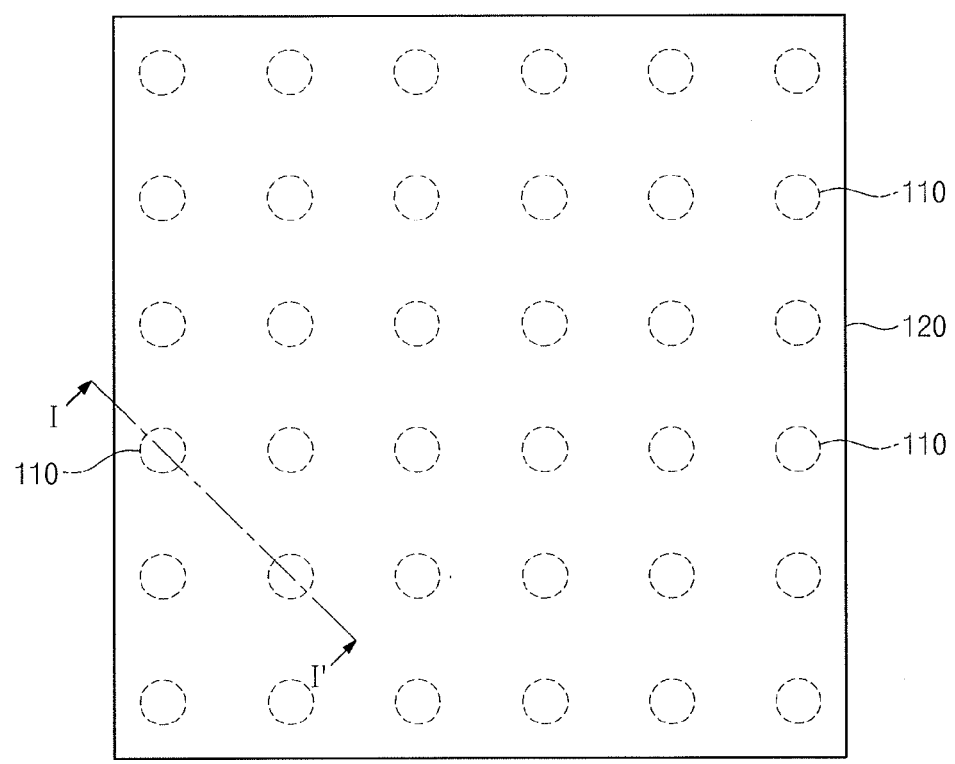

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Additionally, the embodiment in the detailed description will be described with sectional views as ideal exemplary views. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

FIGS. 1A to 11A are plan views illustrating a semiconductor memory device according to an embodiment, and FIGS. 1B to 11B are cross sectional views taken along lines I-I' of FIGS. 1A to 11A, respectively. For the purpose of ease and convenience in explanation, the cross sectional views of FIGS. 1B to 11B are enlarged.

Figure 1B:
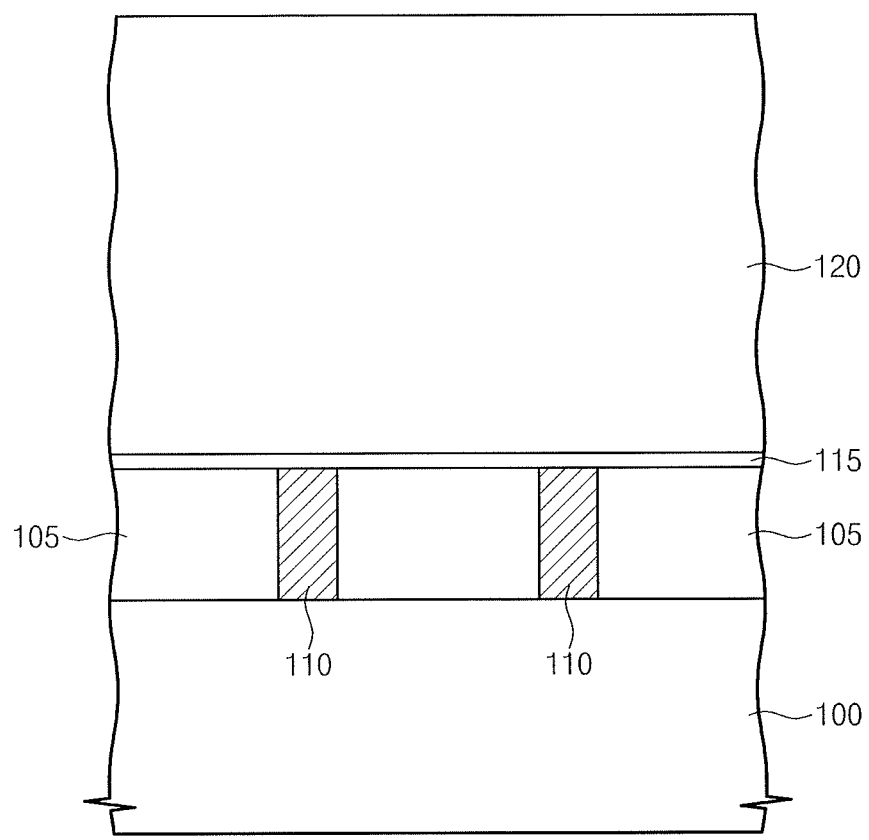

Referring to FIGS. 1A and 1B, an interlayer dielectric layer 105 may be formed on a substrate 100, and a plurality of contact plugs 110 penetrating the interlayer dielectric layer 105 may be formed. As illustrated in FIG. 1A, the contact plugs 110 may be arrayed two-dimensionally along rows and columns in a plan view. Each of the contact plugs 110 may be electrically connected to one of switching elements (not shown) formed in and/or on the substrate 100. For example, a bottom surface of the respective contact plugs 110 may be in contact with a terminal of the respective switching elements. The switching elements may include diodes or field effect transistors. The interlayer dielectric layer 105 may be formed of an oxide layer, a nitride layer and/or an oxynitride layer. The contact plugs 110 may include at least one of a doped semiconductor layer (e.g., a doped silicon layer), a metal layer (e.g., a tungsten layer), a conductive metal nitride layer (e.g., a titanium nitride layer or a tantalum nitride layer) and a transition metal layer (e.g., a titanium layer or a tantalum layer).

An etch stop layer 115 and a lower mold layer 120 are sequentially formed on the substrate having the contact plugs 110. The etch stop layer 115 may include an insulating material having an etch selectivity with respect to the lower mold layer 120. For example, the lower mold layer 120 may be formed of an oxide layer such as a silicon oxide layer, and the etch stop layer 115 may be formed of a nitride layer (e.g., a silicon nitride layer) or an oxynitride layer (e.g., a silicon oxynitride layer).

Figure 2A:
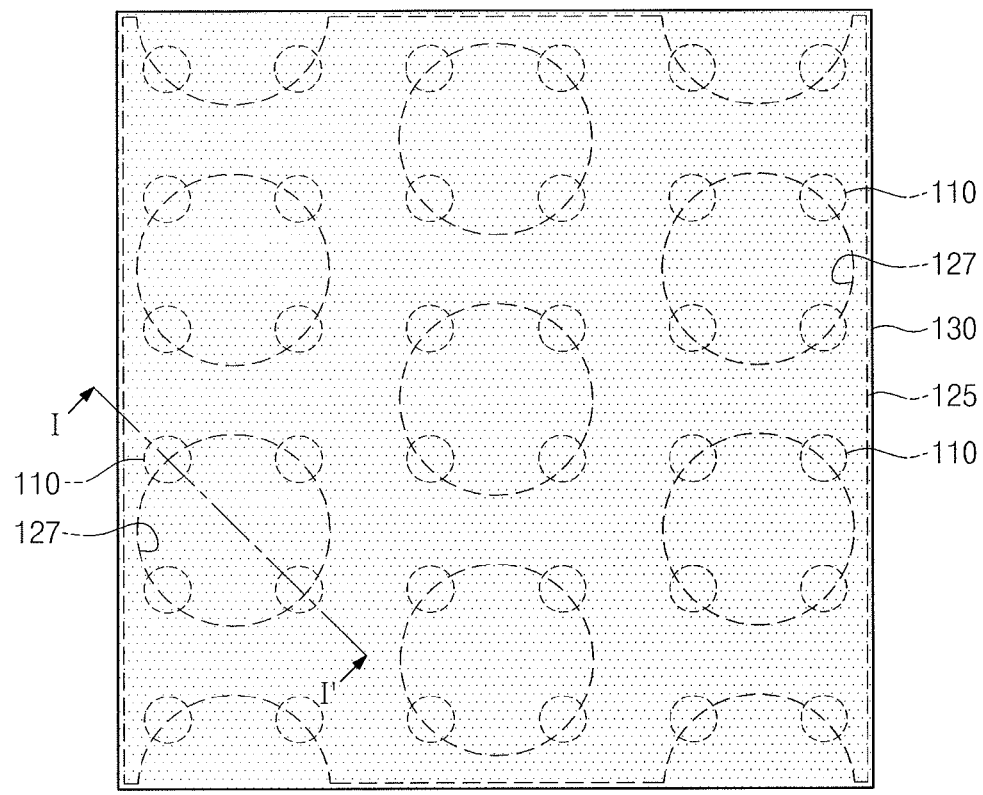
Figure 2B:
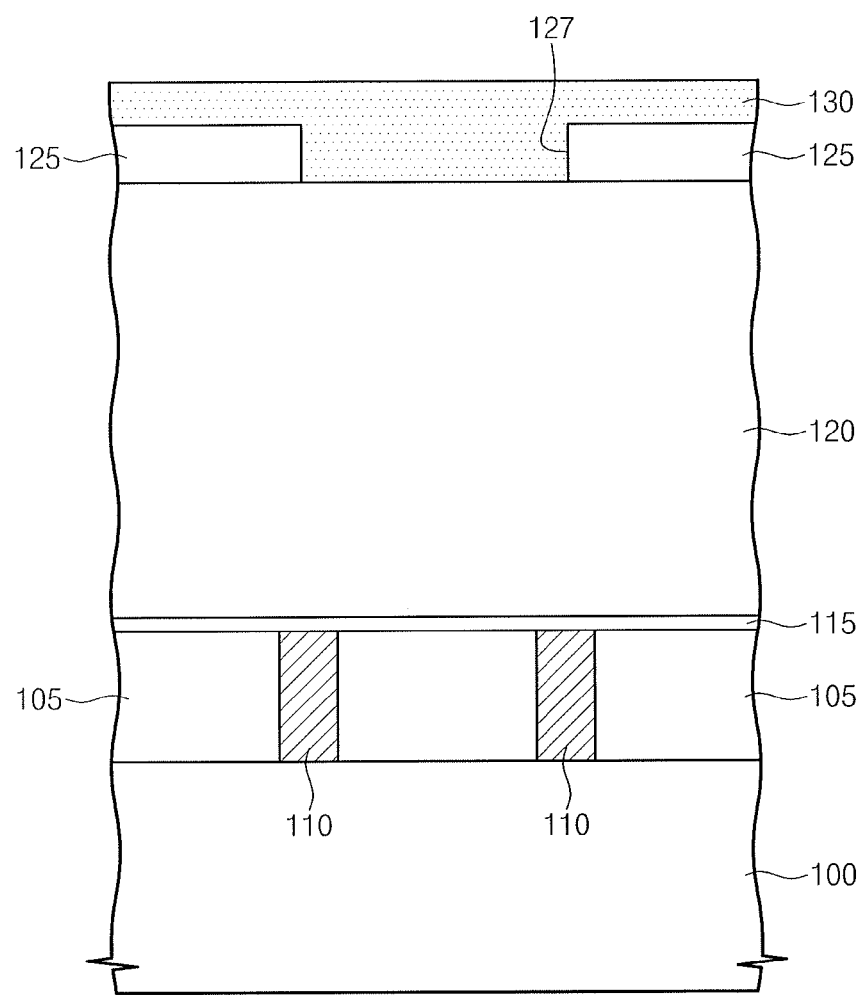

Referring to FIGS. 2A and 2B, a guide layer 125 having a plurality of guide-openings 127 therein may be formed on the lower mold layer 120. The guide-openings 127 may be formed by applying a patterning process, including a photolithography process and an etching process, to the guide layer 125. That is, the plurality of guide-openings 127 may be formed to penetrate the guide layer 125. In an embodiment, the guide layer 125 may include a material having an etch selectivity with respect to the lower mold layer 120. For example, the lower mold layer 120 may be formed of an oxide layer using a plasma enhanced chemical vapor deposition (PE-CVD) technique, and the guide layer 125 may be formed of a tetra-ethyl-ortho-silicate (TEOS) layer and/or a borophosphosilicate glass (BPSG) layer. The lower mold layer 120 and the guide layer 125 may also be formed of other materials. For example, the guide layer 125 may include a material having the same etch rate as the lower mold layer 120.

The guide-openings 127 may overlap with the contact plugs 110 in a plan view. As illustrated in FIG. 2A, each of the guide-openings 127 may overlap with two or more contact plugs 110. The guide-openings 127 may have a circle shape in a plan view. In other implementations, the guide-openings 127 may have an oval shape or polygonal shape in a plan view. The guide-openings 127 may also have various shapes other than the circle shape, the oval shape or the polygonal shape in a plan view.

A hard mask layer 130 filling the guide-openings 127 may be formed on the guide layer 125. The hard mask layer 130 may include a material having an etch selectivity with respect to the guide layer 125. Further, the hard mask layer 130 may have an etch selectivity with respect to the lower mold layer 120. For example, the hard mask layer 130 may be formed of a semiconductor material such as a silicon material.

Figure 3A:
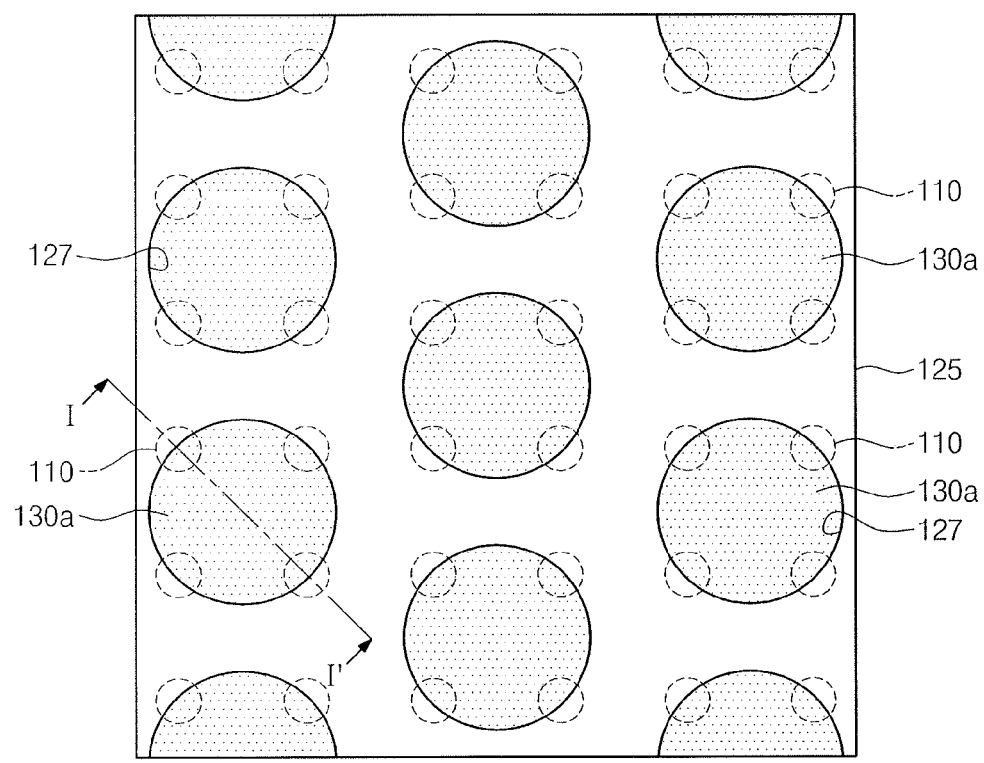
Figure 3B:
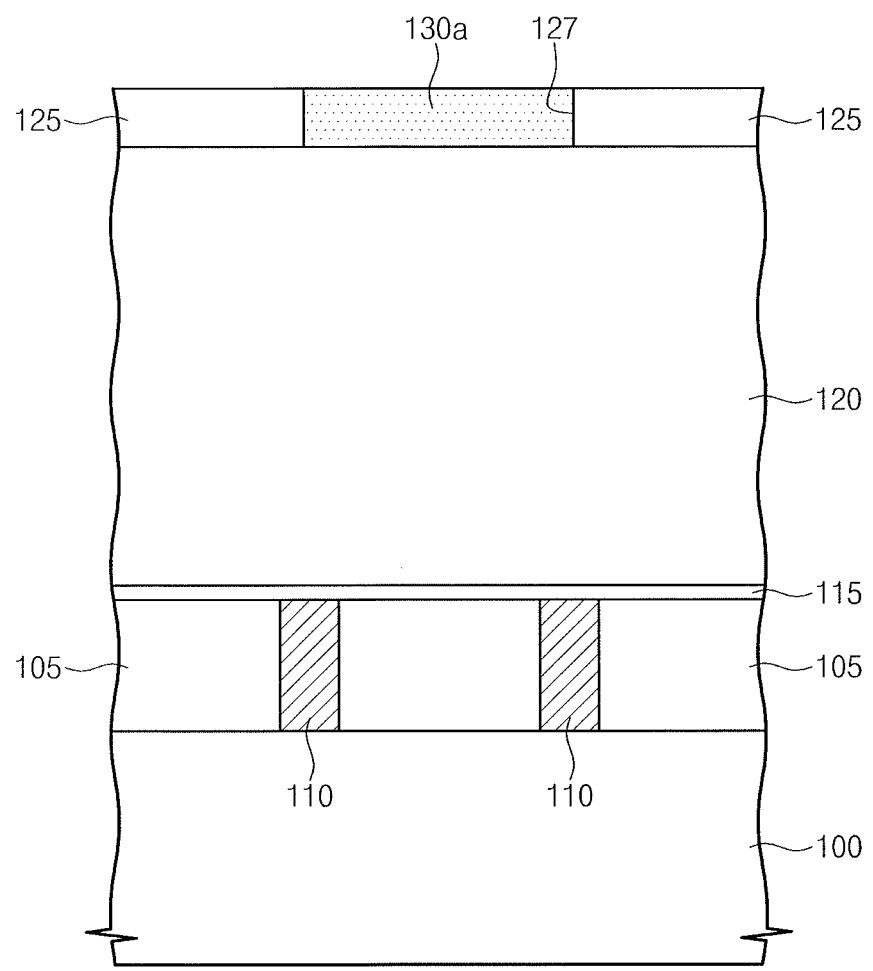

Referring to FIGS. 3A and 3B, the hard mask layer 130 may be planarized until the guide layer 125 is exposed, thereby forming hard mask patterns 130a remaining in the guide-openings 127. The hard mask layer 130 may be planarized using a chemical mechanical polishing (CMP) process or an etch-back process.

As described above, the hard mask patterns 130a may be formed by forming the guide-openings 127 in the guide layer, forming the hard mask layer 130 to fill the guide openings and planarizing of the hard mask layer. For example, the hard mask patterns 130a may be formed using a damascene method.

Figure 4A:
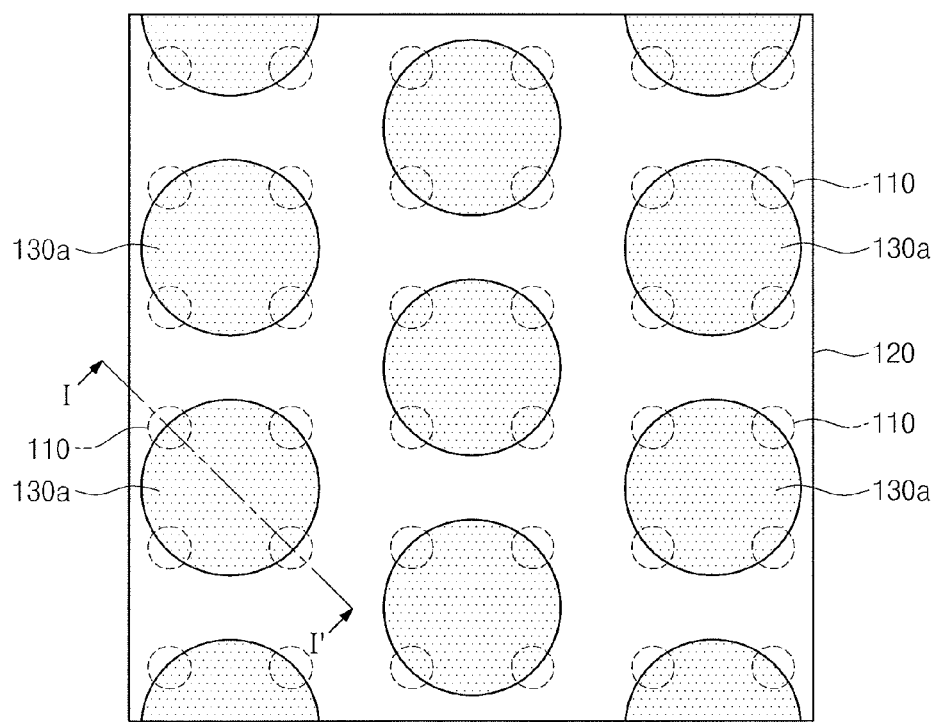
Figure 4B:
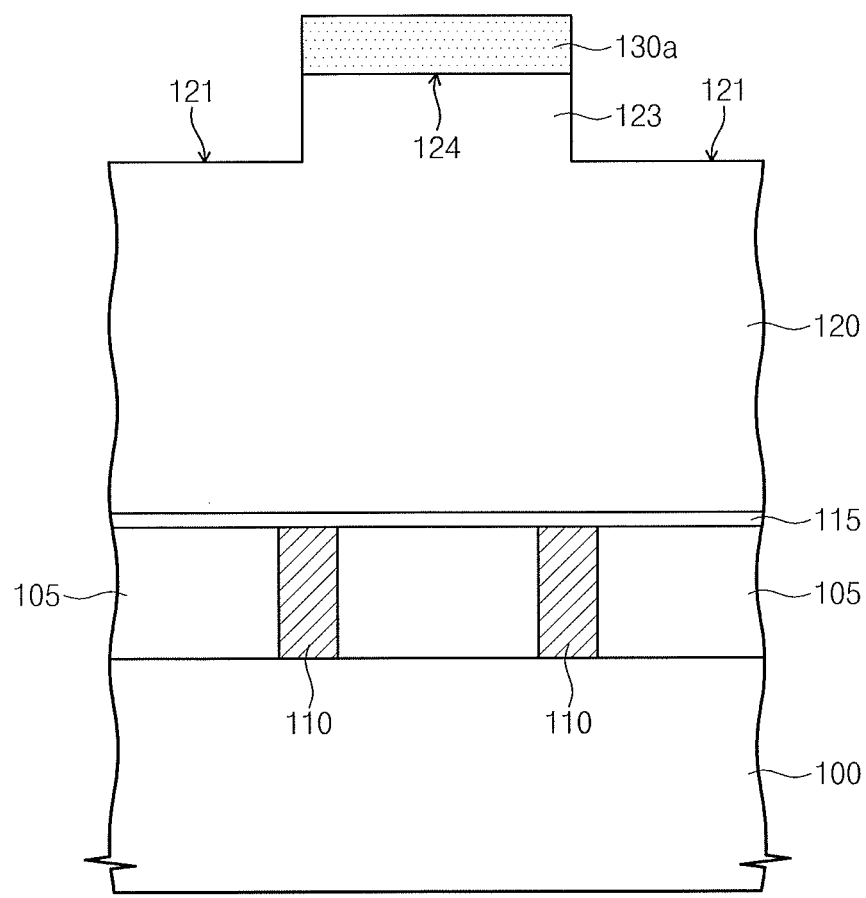

Referring to FIGS. 4A and 4B, the guide layer 125 and a top portion of the lower mold layer 120 may be etched using the hard mask patterns 130a as etching masks. As a result, the guide layer 125 may be removed, and protrusions 123 may be defined under the hard mask patterns 130a, respectively. The protrusions 123 represent portions of the lower mold layer 120 that were protected from etching by the hard mask layer patterns 130a. The protrusions 123 may protrude relatively with respect to the etched portion of the lower mold layer 120. The etched lower mold layer 120 may have a top surface 121 that is lower than top surfaces of the protrusions 123, as a result of the lower mold layer 120 being etched using the hard mask patterns 130a as etching masks.

Figure 5A:
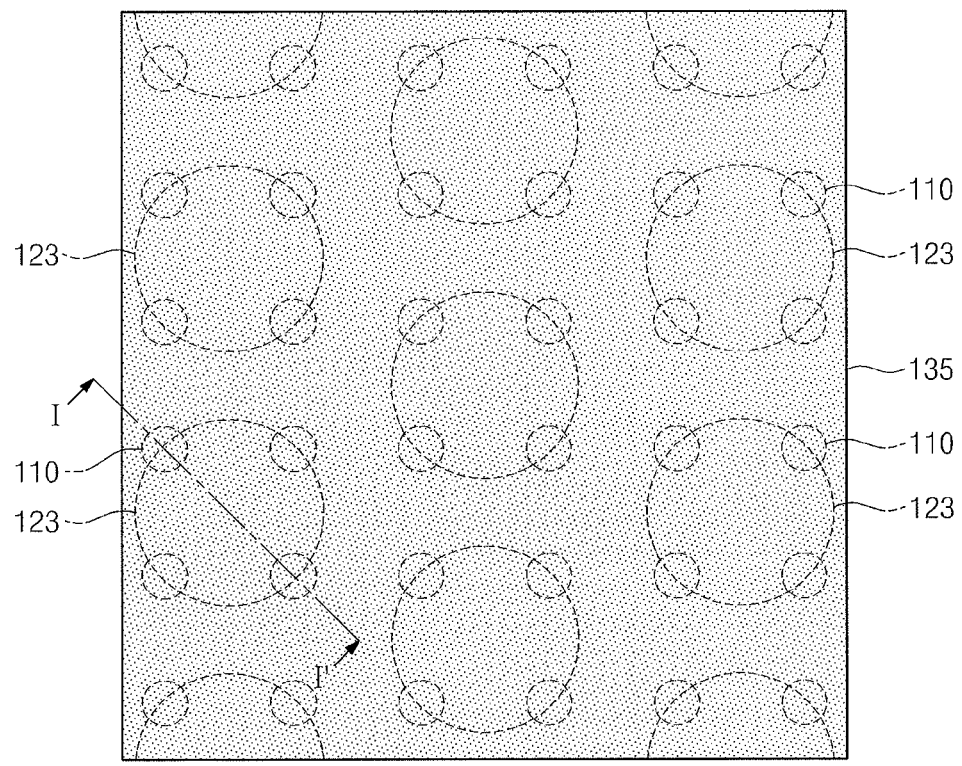
Figure 5B:
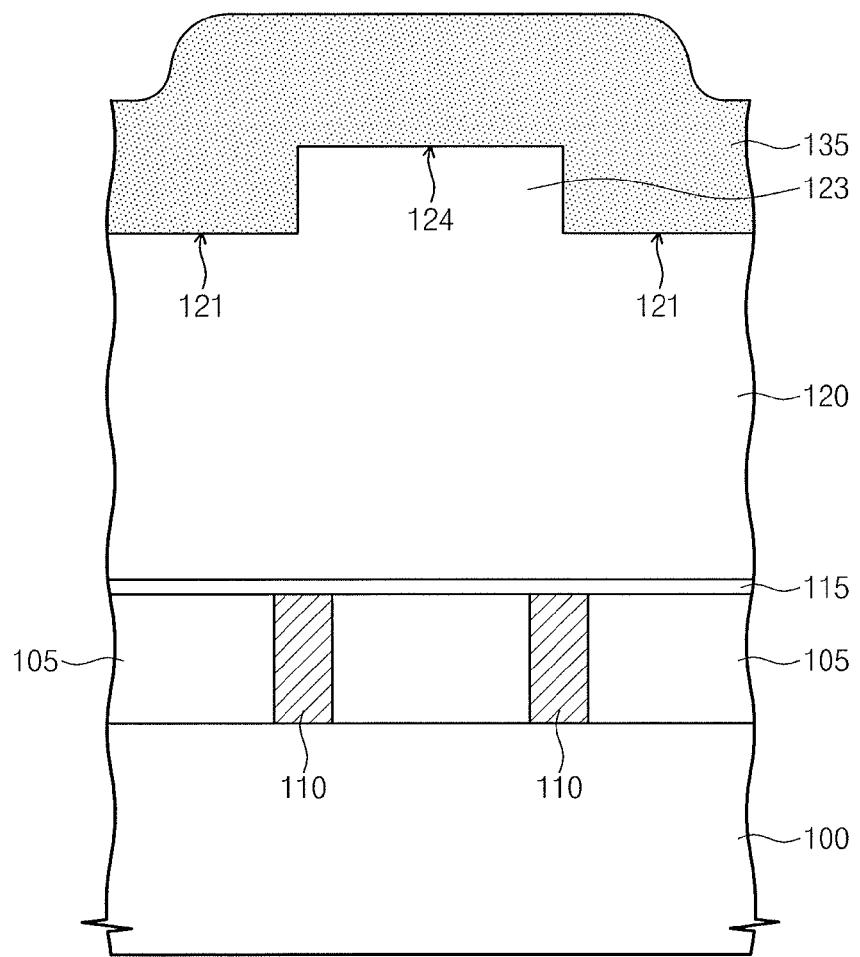

Referring to FIGS. 5A and 5B, the hard mask patterns 130a may be removed to expose the top surfaces of the protrusions 123. A support layer 135 may be formed on the substrate where the hard mask patterns 130a are removed. The support layer 135 may be formed of an insulation material that is different from that of the lower mold layer 120. Thus, the support layer 135 may have an etch selectivity with respect to the lower mold layer 120. For example, the support layer 135 may be formed of a nitride material such as a silicon nitride material.

Figure 6A:
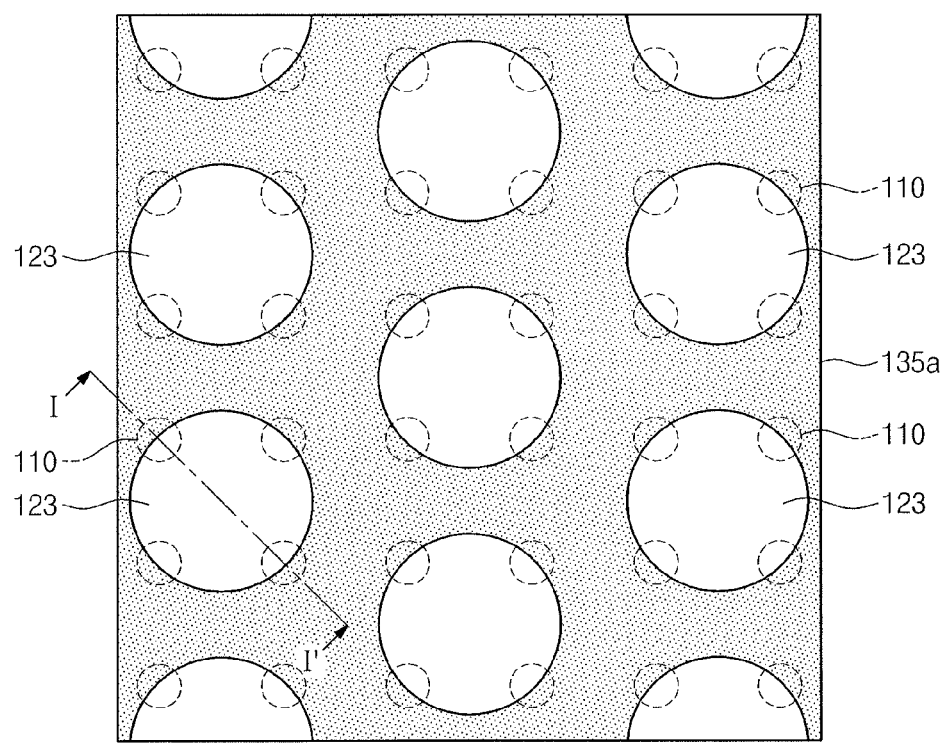
Figure 6B:
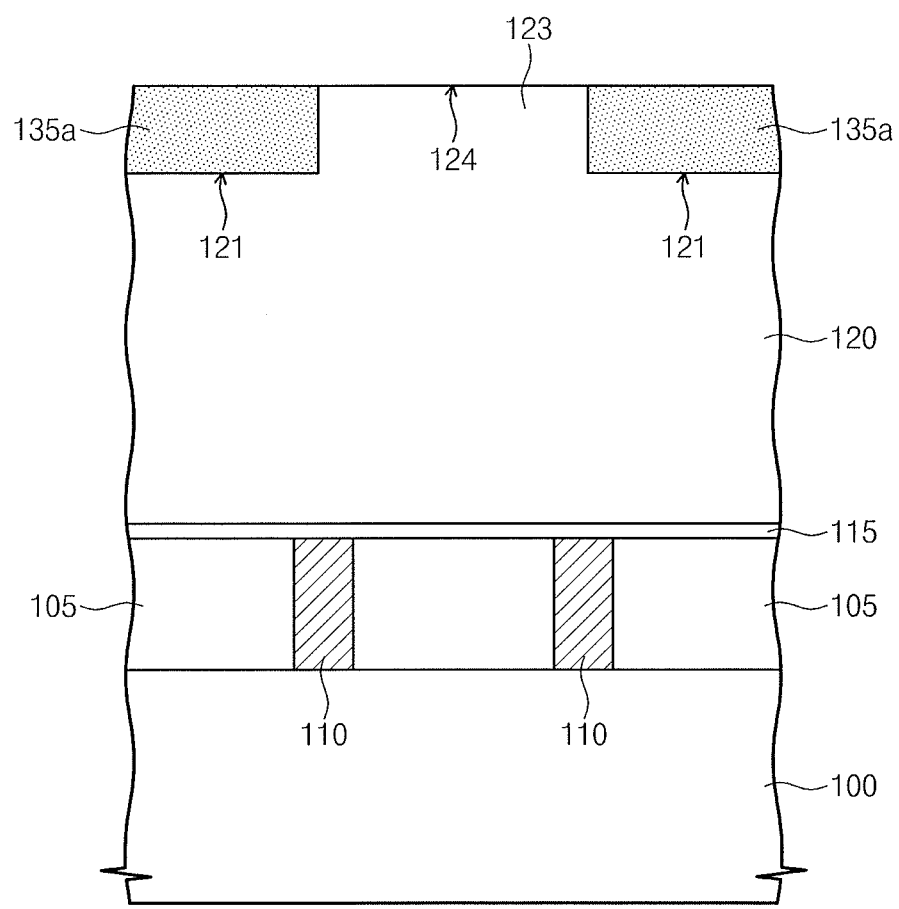

Referring to FIGS. 6A and 6B, the support layer 135 may be planarized until the top surfaces of the protrusions 123 are exposed. As a result, a support pattern 135a may be formed to remain between the protrusions 123. The support pattern 135a may be present on the etched top surface 121 of the lower mold layer 120. As a result of the planarization of the support layer 135, a top surface of the support pattern 135a may be substantially coplanar with the top surfaces of the protrusions 123. The support layer 135 may be planarized using a chemical mechanical polishing (CMP) process. Alternatively, the support layer 135 may be planarized using an etch-back process. In the event that the support layer 135 is planarized using an etch-back process, it is desirable that the etch-back process not employ a high ionic plasma such as may be used in a deposition of a high density plasma (HDP) oxide layer.

As described above, the support pattern 135a may be formed by depositing a support layer 135 on and between the protrusions 123 and planarizing the support layer 135. For example, the support pattern 135a may be formed using a damascene method.

According to the fabrication method described above, the support layer 135 may be formed after removal of the hard mask patterns 130a. In another implementation, formation of the support layer 135 may be followed by removal of the hard mask patterns 130a. The support layer 135 may be formed on the hard mask patterns 130a and the etched lower mold layer 120, and the support layer 135 and the hard mask patterns 130a may be planarized until the top surfaces of the protrusions 123 are exposed, thereby removing the hard mask patterns 130a and forming the support pattern 135a.

Figure 7A:
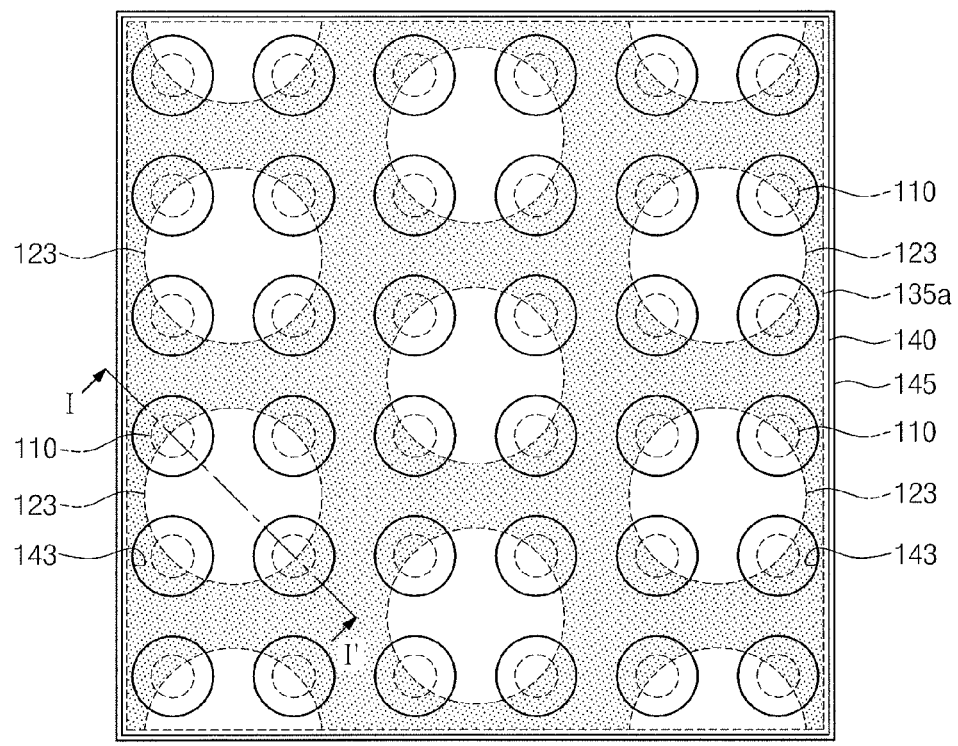
Figure 7B:
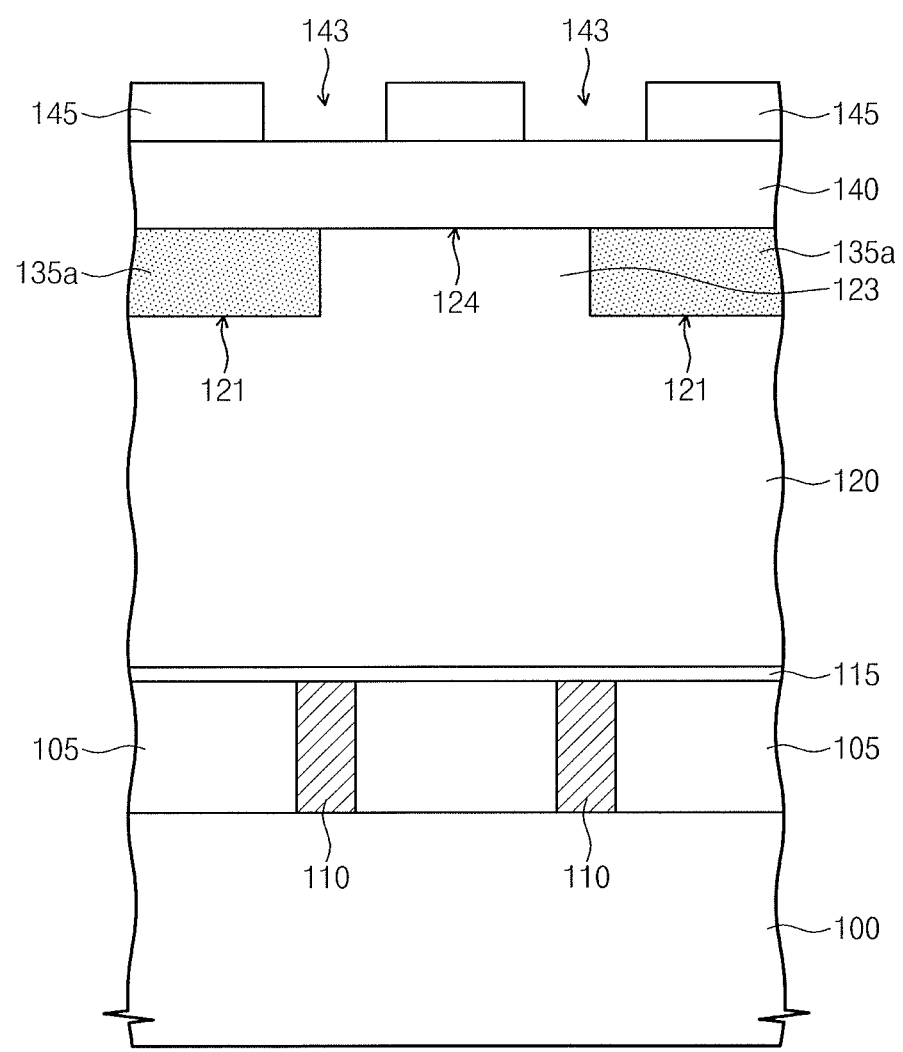

Referring to FIGS. 7A and 7B, an upper mold layer 140 may be formed on the support pattern 135a and the protrusions 123. The upper mold layer 140 may be formed of a material having an etch selectivity with respect to the support pattern 135a. For example, the upper mold layer 140 may be formed of an oxide material such as a silicon oxide material.

A mask layer 145 may be formed on the upper mold layer 140. The mask layer 145 may have a plurality of hole-openings 143 exposing portions of the upper mold layer 140. As illustrated in FIG. 7A, the hole-openings 143 may be laterally separated from each other. In a plan view, the hole-openings 143 may overlap with the contact plugs 110, respectively.

Each of the hole-openings 143 may overlap with a portion of a protrusion 123. Further, each of the hole-openings 143 may also overlap with a portion of the support pattern 135a adjacent to the protrusion 123.

As illustrated in FIG. 7A, each of the protrusions 123 may be overlapped by at least two hole-openings 143.

Figure 8A:
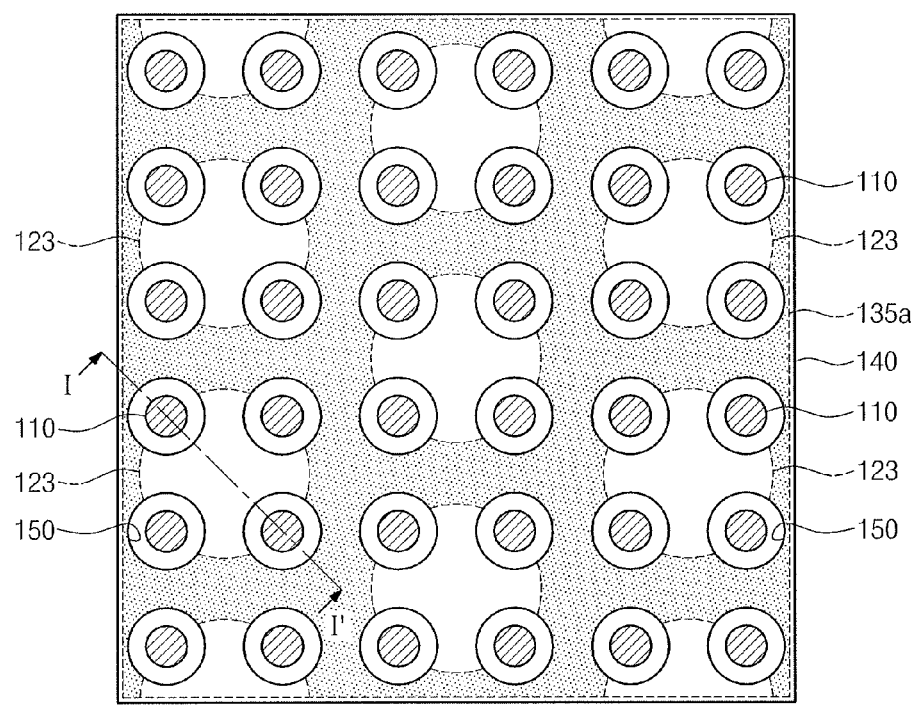
Figure 8B:
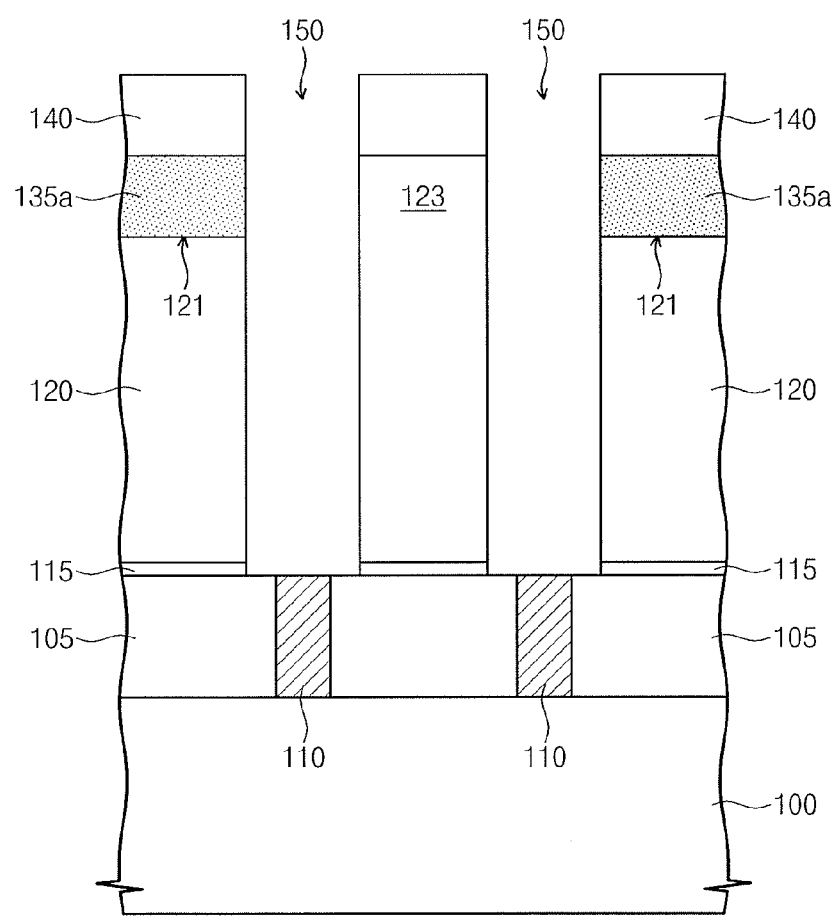

Referring to FIGS. 8A and 8B, using the mask layer 145 as an etch mask, the upper mold layer 140 and the lower mold layer 120 may be etched to form electrode holes 150. The electrode holes 150 may expose the etch stop layer 115. The exposed portions of the etch stop layer 115 may be then removed to expose the contact plugs 110. As such, the electrode holes 150 may expose the contact plugs 110, respectively.

The electrode holes 150 may be formed under the hole-openings 143, respectively. During the etching process for forming the electrode holes 150, portions of the support pattern 135a overlapping with the hole-openings 143 may also be etched and removed. In an embodiment, during at least a part of a total etching time period of the etching process for forming the electrode holes 150, an etch rate of the lower mold layer 120 may be substantially the same as that of the support pattern 135a. However, The etch rates of the lower mold layer 120 and the support pattern 135a during the etching process for forming the electrode holes 150 may vary from what is described above.

As illustrated in FIG. 8B, an upper portion of the respective electrode holes 150 may be defined by a sidewall of the protrusion 123 and a sidewall of the support pattern 135a. That is, each of the electrode holes 150 may expose a portion of a sidewall of the support pattern 135a adjacent to the protrusion 123. After formation of the electrode holes 150, the mask layer 145 may be removed.

Figure 9A:
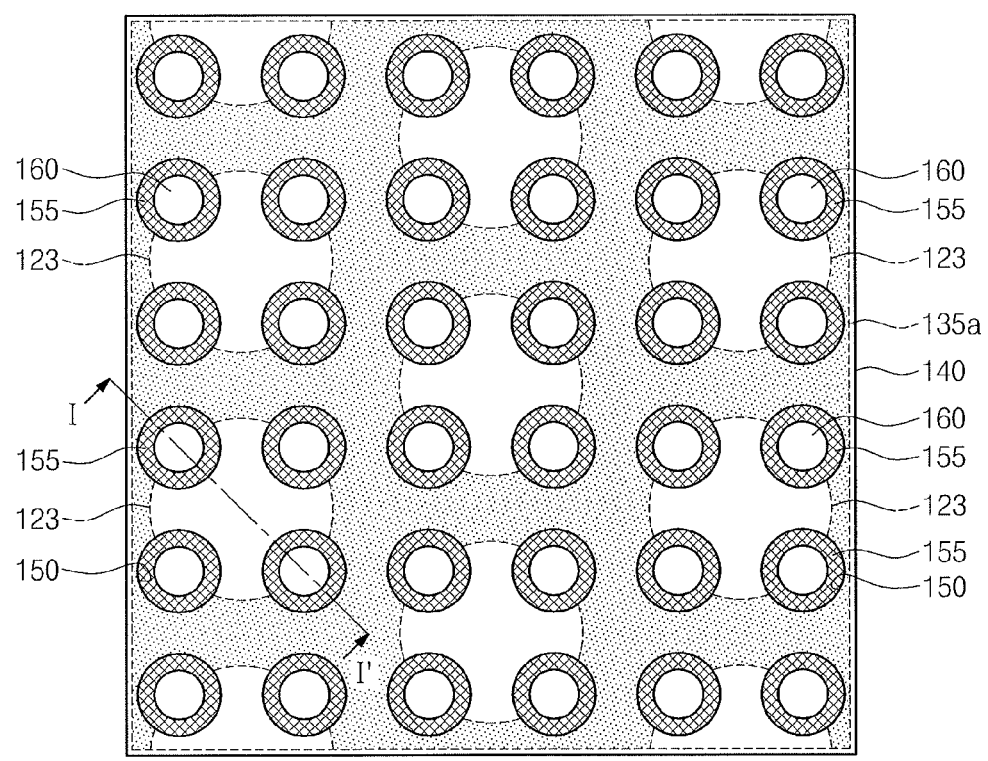
Figure 9B:
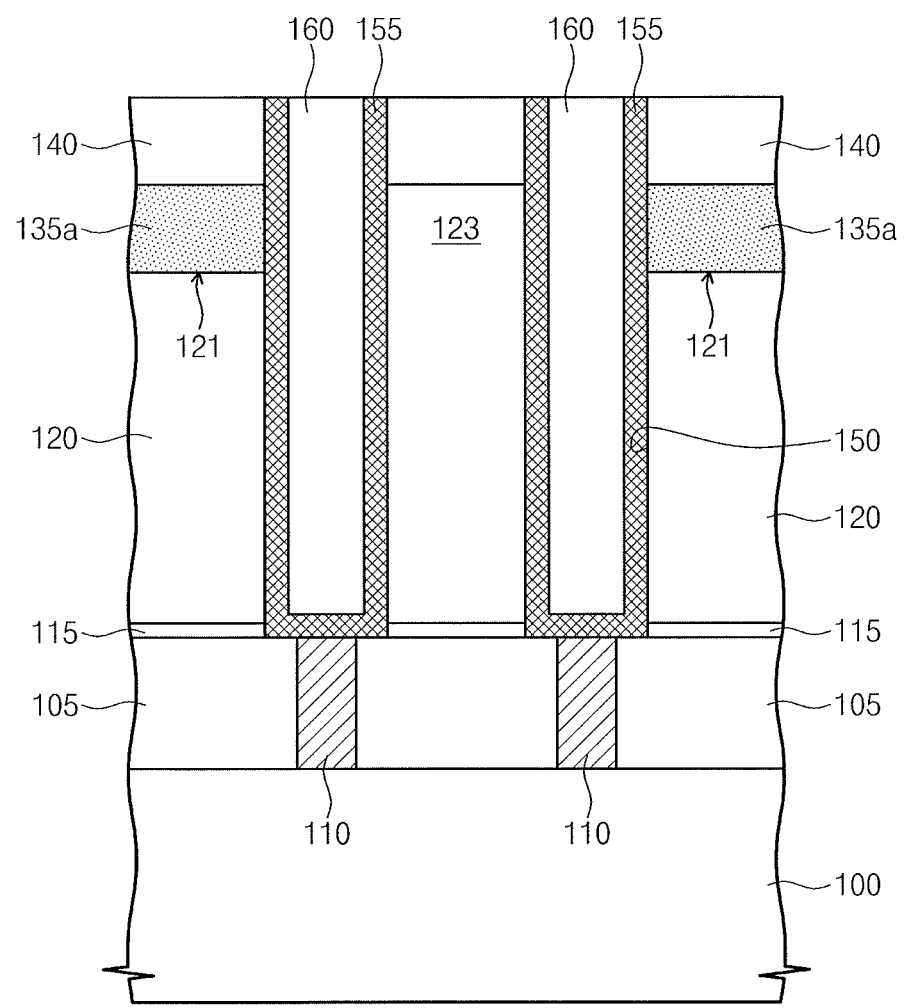

Referring to FIGS. 9A and 9B, a lower electrode layer may be conformably formed on the substrate including the electrode holes 150, and a filling layer filling the electrode holes 150 may be formed on the lower electrode layer. The filling layer and the lower electrode layer may be planarized until the upper mold layer 140 is exposed, thereby forming a lower electrode 155 and a filling pattern 160 in each of the electrode holes 150. All the lower electrodes 155 may be in contact with the support pattern 135a.

Each of the lower electrodes 155 may include a conductive material. For example, the lower electrode layer may include at least one of a doped semiconductor layer (e.g., a doped silicon layer), a conductive metal nitride layer (e.g., a titanium nitride layer or a tantalum nitride layer) and a transition metal layer (e.g., a titanium layer or a tantalum layer). The filling patterns 160 may be formed of a material having an etch selectivity with respect to the support pattern 135a. Further, filling patterns 160 may have substantially the same etch rate as the lower and upper mold layers 120 and 140. Alternatively, the filling patterns 160 may have an etch rate that is higher than the etch rates of the lower and upper mold layers 120 and 140. For example, the filling patterns 160 may be include an oxide layer such as a silicon oxide layer.

Figure 10A:
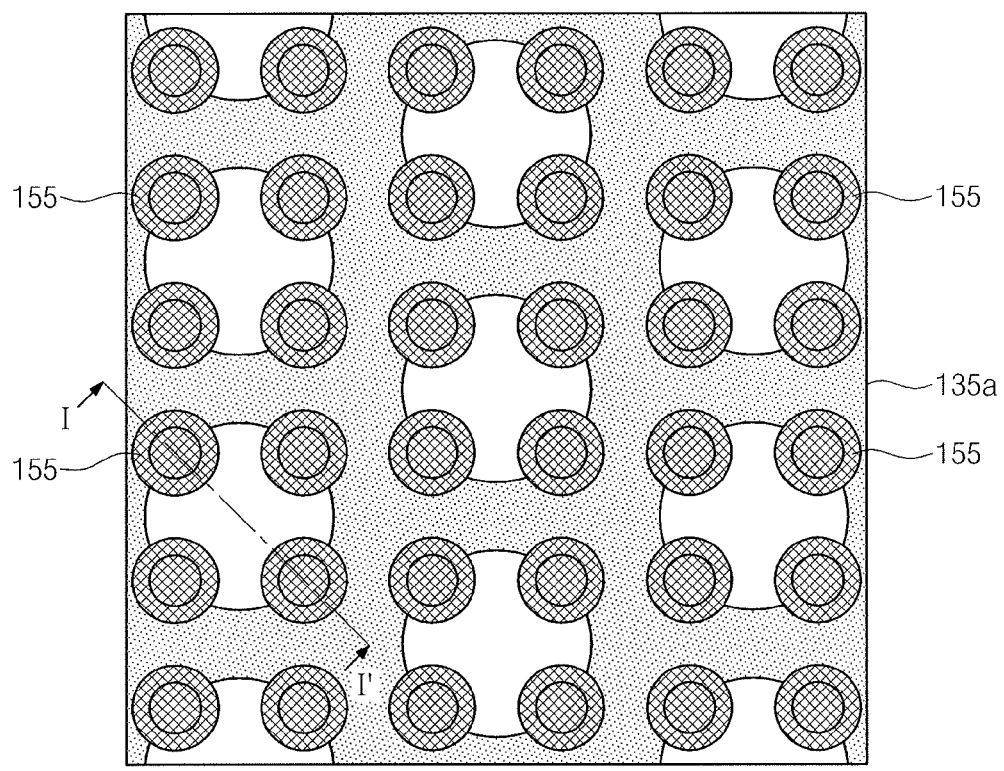
Figure 10B:
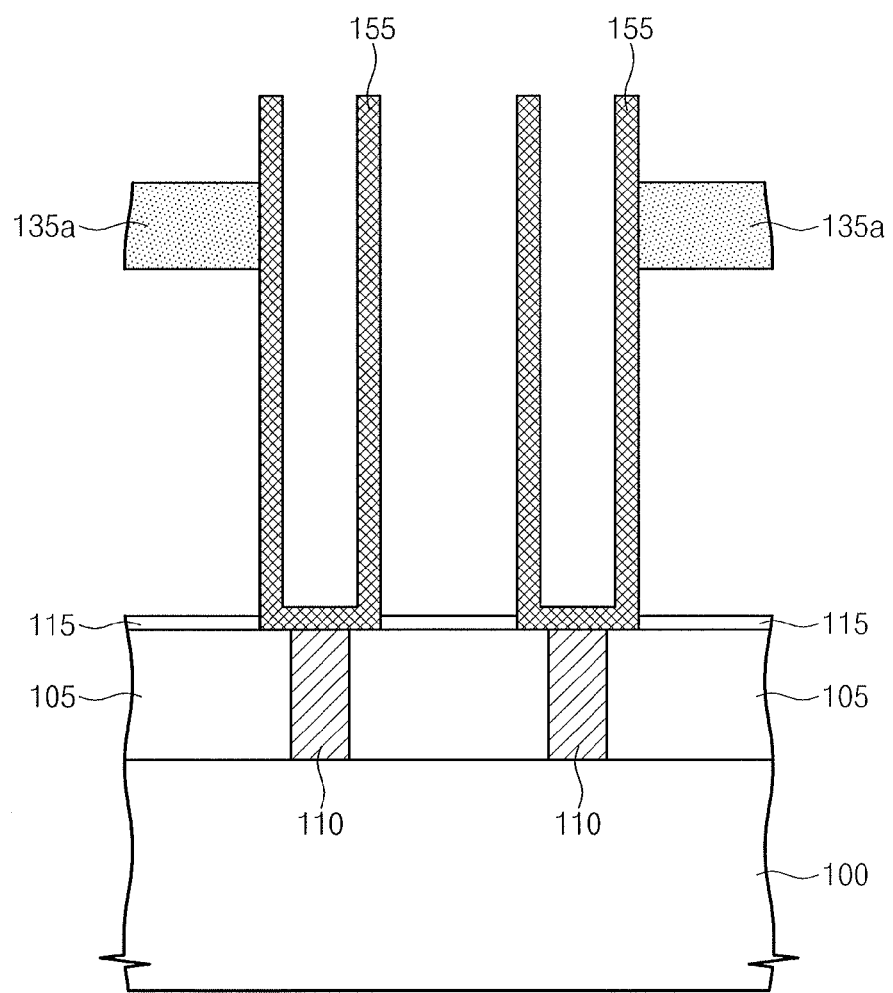

Referring to FIGS. 10A and 10B, the upper mold layer 140, the lower mold layer 120 and the filling patterns 160 may be removed to expose surfaces of the lower electrodes 155. The exposed surface of the respective lower electrodes 155 may include a surface exposed by removal of the filling pattern 160 and a surface exposed by removal of the lower and upper mold layers 120 and 140.

The protrusions 123 that extend from the lower mold layer 120 may be in contact with the upper mold layer 140. The lower mold layer 120 may be removed together with the upper mold layer 140. The lower and upper mold layers 120 and 140 and the filling patterns 160 may be removed using an isotropic etching process, for example, a wet etching process.

While the lower and upper mold layers 120 and 140 and the filling patterns 160 are removed, the support pattern 135a may still exist and the lower electrodes 155 may be supported by the support pattern 135a. The support pattern 135a may prevent the lower electrodes 155 from leaning. While the lower and upper mold layers 120 and 140 and the filling patterns 160 are removed, the etch stop layer 115 may also remain. The interlayer dielectric layer 105 may be protected by the etch stop layer.

Figure 11A:
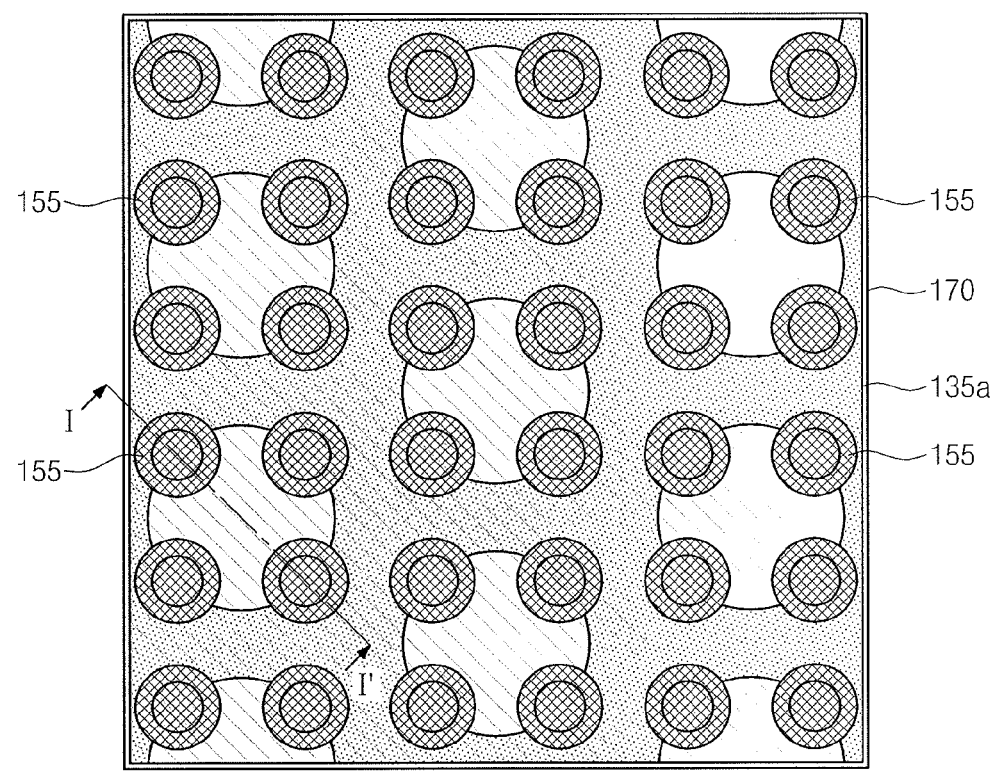
Figure 11B:
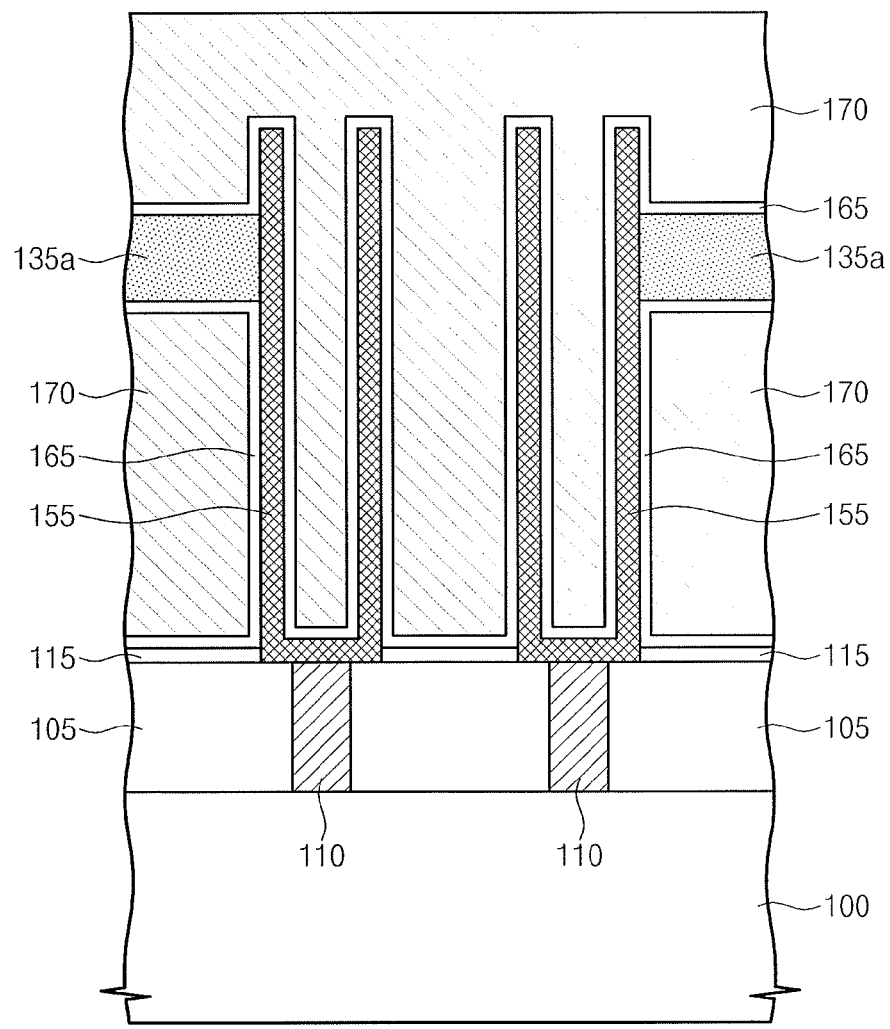

Referring to FIGS. 11A and 11B, a capacitor-dielectric layer 165 may be formed on the surfaces of the lower electrodes 155. An upper electrode 170 may be formed on the capacitor-dielectric layer 165. The capacitor-dielectric layer 165 may be formed to include an oxide material, a nitride material, an oxynitride material and/or a high-k dielectric material. The high-k dielectric material may include an insulating metal nitride material such as an aluminum oxide material and/or a hafnium oxide material. The upper electrode 170 may be formed of a conductive material. For example, the upper electrode 170 may be formed to include at least one of a doped semiconductor layer (e.g., a doped silicon layer), a conductive metal nitride layer (e.g., a titanium nitride layer or a tantalum nitride layer), a metal layer (e.g., a tungsten layer) and a transition metal layer (e.g., a titanium layer or a tantalum layer).

By way of review, as semiconductor memory devices become more highly integrated, a height of features such as cell capacitors has been increased to obtain sufficient cell capacitance in a limited planar area. However, when the height of the cell capacitors increases, the reliability of DRAM devices including the cell capacitors may be reduced. For example, when the height of the cell capacitors is increased, the cell capacitors may easily lean to cause a malfunction of the DRAM devices. As a result, an increase of the height of the cell capacitors may lead to a degradation of the reliability of the DRAM devices.

In this regard, the fabrication method of a semiconductor memory device as described above represents an advance in the art. The hard mask patterns 130a may be formed using a damascene process, and the support pattern 135a may also be formed using a damascene process that utilizes the protrusions 123 of the lower mold layer 120. As such, it may be easy to increase a process margin in the fabrication of the support pattern. For example, in the event that a width of the hard mask patterns 130a becomes reduced, a process margin of a photolithography process for defining the hard mask patterns 130a may be decreased. However, according to the embodiments, the hard mask patterns 130a may be formed using a damascene technique that utilizes the guide-holes 127 of the guide layer 125. Thus, a process margin of the process for forming the hard mask patterns 130a may be increased.

Moreover, the support pattern 135a may also be formed using a damascene technique that utilizes the protrusions 123. Thus, the lower and upper mold layers 120 and 140 may be free from voids therein. If the support pattern were to be formed using a photolithography process and an etching process, the support layer could be formed on a flat lower mold layer and the support layer could be patterned using a photolithography process and the etching process. In this case, the etched regions (corresponding to the regions at which the protrusions are located) of the support layer could be filled with the upper mold layer. If the etched regions of the support layer have a high aspect ratio, the upper mold layer may not completely fill the etched regions of the support layer. That is, after formation of the upper mold layer, voids may be formed in the etched regions of the support layer. However, according to the embodiments described above, the support pattern 135a is formed using a damascene technique. Thus, the lower and upper mold layers 120 and 140 may be free from such voids.

In addition, the support layer 135 may be planarized using an etch-back process that does not employ a high ionic plasma such as may be used in the deposition of a high density plasma (HDP) oxide layer. Therefore, damage to the support pattern 135a may be prevented. As a result, during formation of the electrode holes 150, a phenomenon that the support pattern 135a is laterally recessed may be suppressed. Accordingly, electrical shortages between the adjacent lower electrodes 155 may be prevented.

Furthermore, the lower electrodes 155 may be formed after the formation of the support pattern 135a. Thus, even if the planarization process for forming the support pattern 135a generates damage, the electrodes 155 may not be damaged during formation of the support pattern 135a. As a result, the amount of byproducts, including atomic element contaminants, can be minimized in the lower electrodes 155.

If the support pattern 135a were to be formed after the formation of the lower electrode 155, the lower electrodes 155 could be directly damaged due to the etching process or the planarization process for forming the support pattern 135a and the etch byproduct, including the atomic element contaminants, in the lower electrodes 155 could be increasingly generated. However, according to the embodiments, the lower electrodes 155 may be formed after formation of the support pattern 135a as described above. The fabrication process according to the embodiments can minimize the amount of byproducts, including the atomic element contaminants, in the lower electrodes 155.

Accordingly, a high reliable and highly integrated semiconductor memory device may be realized.

In the fabrication method described above, the protrusions 123 may be formed to have a circle shape, an oval shape or a polygonal shape in a plan view. In other implementations, the protrusions 123 may be formed to have a different shape from the circle shape, the oval shape or the polygonal shape. A method of forming protrusions having a different shape will be described hereinafter with reference to FIGS. 12, 13 and 14.

Figure 12:
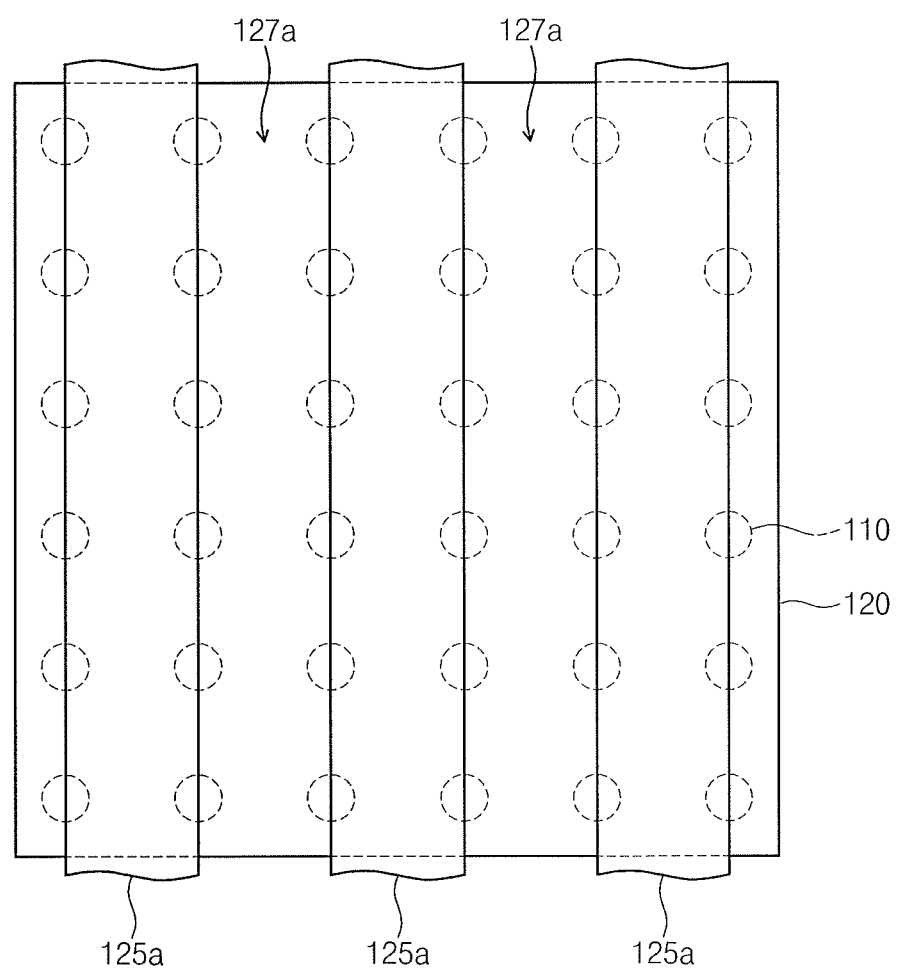
FIGS. 12 to 14 illustrate plan views depicting a modified embodiment of methods of fabricating semiconductor memory devices according to embodiments.
Figure 13:
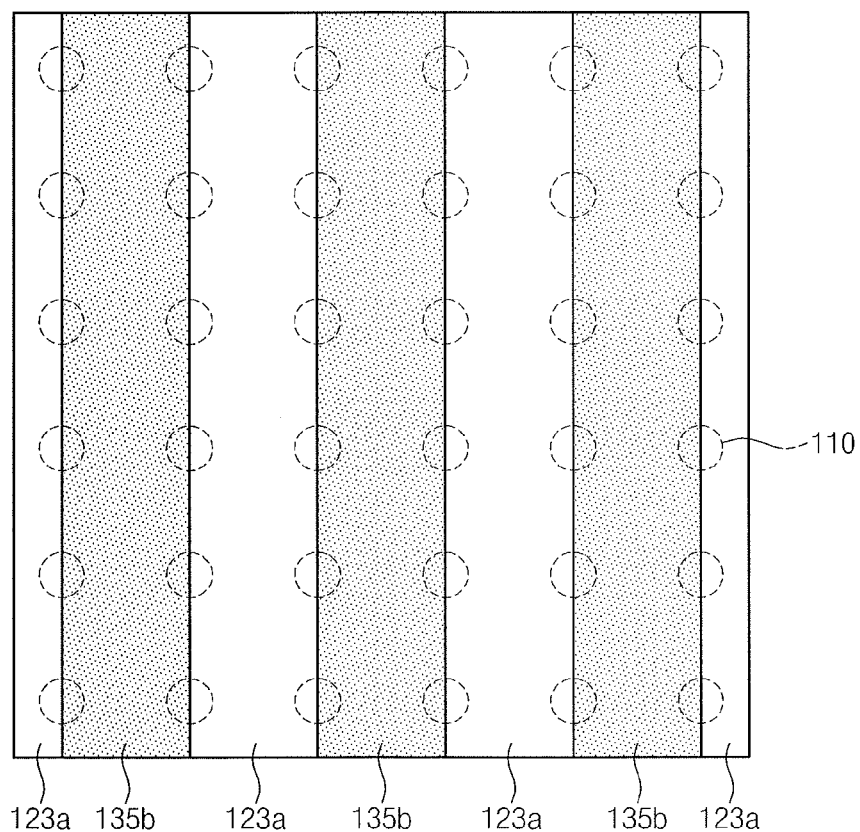
Figure 14:
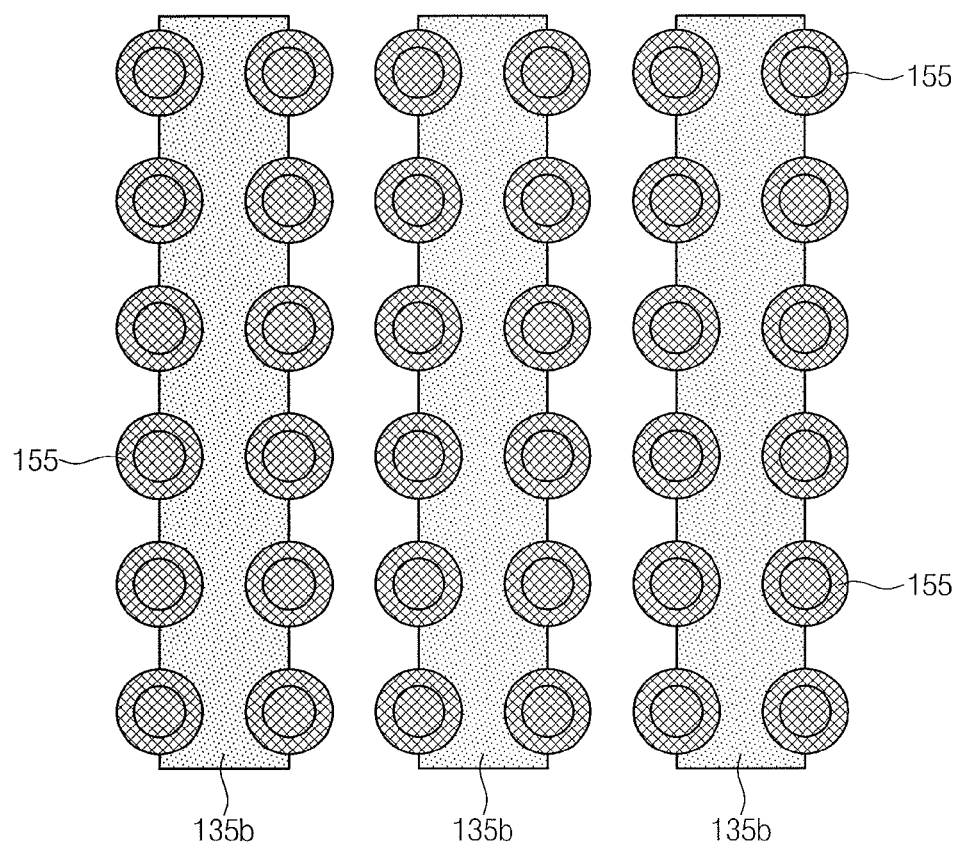

FIGS. 12, 13 and 14 are plan views illustrating a modified embodiment of methods of fabricating semiconductor memory devices according to embodiments.

Referring to FIG. 12, a guide layer 125a on the lower mold layer 120 may have guide-openings 127a. The guide-openings 127a may have groove shapes which extend in a predetermined direction to be parallel with each other. The guide layer 125a may be formed of the same material as the guide layer 125 illustrated in FIG. 2A.

The processes for forming the support pattern 135a described with reference to FIGS. 2A to 6A and FIGS. 2B to 6B may be performed using the guide layer 125a having the guide-openings 127a. As a result, protrusions 123a extended from the lower mold layer 120 and support patterns 135b between the protrusions 123a may be formed, as illustrated in FIG. 13. The protrusions 123a may have line shapes that extend in parallel in the predetermined direction. The support patterns 135b may also have line shapes that extend in parallel in the predetermined direction. The protrusions 123a and the support patterns 135b may be alternately arrayed in a direction perpendicular to the predetermined direction.

Subsequently, the processes for forming the lower electrodes 155 described with reference to FIGS. 7A to 10A and FIGS. 7B to 10B may be performed. As a result, lower electrodes 155 and support patterns 135b illustrated in FIG. 14 may be formed. Some of the lower electrodes 155 may be formed at both sidewalls of each support pattern 135b and may be supported by the support pattern 135b. The capacitor-dielectric layer 165 and the upper electrode 170 may be then formed using the same processes as described with reference to FIGS. 11A and 11B.

The semiconductor memory devices described above may be encapsulated using various packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the semiconductor memory device.

According to the embodiments set forth above, hard mask patterns for defining a shape of a support pattern disposed between lower electrodes of a memory device may be formed using a damascene technique. Further, the support pattern may be formed using protrusions extended from a lower mold layer and using a planarization process. As such, the fabrication of the support pattern may become easy and a process margin may be increased. Moreover, various problems (e.g., voids, etch byproduct and/or leaning of cell capacitors, etc.) occurring during fabrication of the semiconductor memory devices may be reduced. As a result, a high reliable and highly integrated semiconductor memory device may be provided.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A method of fabricating a semiconductor memory device, the method comprising:
   forming a hard mask pattern using a damascene method on a lower mold layer stacked on a substrate;
   etching the lower mold layer using the hard mask pattern as an etch mask to form an etched lower mold layer having a protrusion under the hard mask pattern and an etched region defined by the protrusion, the etched region having a bottom surface located at a lower level than a top surface of the protrusion;
   forming a support pattern in the etched region of the etched lower mold layer;
   forming a lower electrode supported by the support pattern; and removing the lower mold layer.

2. The method as claimed in claim 1, wherein the forming of the hard mask pattern includes:
   forming a guide layer on the lower mold layer, the guide layer having a guide-opening;
   forming a hard mask layer on the guide layer, the hard mask layer filling the guide-opening;
   planarizing the hard mask layer until the guide layer is exposed, thereby forming a hard mask pattern remaining in the guide-opening; and
   removing the guide layer.

3. The method as claimed in claim 1, wherein the forming of the support pattern includes:
   forming a support layer on the substrate having the protrusion; and
   planarizing the support layer until the top surface of the protrusion is exposed.

4. The method as claimed in claim 3, further including removing the hard mask pattern on the protrusion prior to the forming of the support layer.

5. The method as claimed in claim 1, wherein the forming of the lower electrode comprises:
   forming an electrode hole penetrating the lower mold layer and exposing at least a portion of a sidewall of the support pattern; and
   fabricating the lower electrode in the electrode hole.

6. The method as claimed in claim 5, further including forming an upper mold layer on the support pattern and the protrusion prior to the forming of the electrode hole,
   wherein the forming of the electrode hole includes forming the electrode hole to penetrate the upper and lower mold layers and expose at least the portion of the sidewall of the support pattern, and wherein the removing of the lower mold layer includes removing both the lower mold layer and the upper mold layer.

7. The method as claimed in claim 6, wherein the forming of the electrode hole includes:
   forming a mask layer having at least one hole-opening on the upper mold layer, a bottom surface of the hole-opening overlapping with a portion of the top surface of the protrusion; and
   etching the upper mold layer and the lower mold layer using the mask layer as an etch mask, thereby forming the electrode hole.

8. The method as claimed in claim 7, wherein the mask layer includes a plurality of hole-openings that expose respective portions of the top surface of the protrusion,
   wherein the forming of the electrode hole includes forming a plurality of electrode holes respectively under the plurality of hole-openings, and
   wherein the fabricating of the lower electrode includes forming a plurality of lower electrodes respectively in the plurality of the electrode holes.

9. The method as claimed in claim 7, wherein:
   the bottom surface of the hole-opening of the mask layer overlaps with a portion of the support pattern adjacent to the protrusion, and
   the electrode hole is formed by etching the upper mold layer, the lower mold layer and the portion of the support pattern overlapped by the bottom surface of the hole-opening using the mask layer as an etch mask.

10. The method as claimed in claim 5, wherein the forming of the lower electrode in the electrode hole comprises:
    conformably forming a lower electrode layer on the substrate having the electrode hole;
    forming a filling layer filling the electrode hole on the lower electrode layer; and
    planarizing the filling layer and the lower electrode layer to form the lower electrode and a filling pattern in the electrode hole,
    wherein the removing of the lower mold layer includes removing the lower mold layer and the filling pattern.

11. The method as claimed in claim 1, further comprising:
    forming a capacitor-dielectric layer on a surface of the lower electrode; and
    forming an upper electrode on the capacitor-dielectric layer.

12. The method as claimed in claim 1, wherein the protrusion is formed to have a circle shape, an oval shape, a polygonal shape or a line shape extending in one direction in a plan view.

13. A method of fabricating a semiconductor memory device, the method comprising:
    forming a guide layer having a guide-opening on a lower mold layer stacked on a substrate;
    forming a hard mask layer filling the a guide-opening;
    planarizing the hard mask layer until the guide layer is exposed, thereby forming a hard mask pattern in the guide-opening;
    etching the guide layer and the lower mold layer using the hard mask pattern as an etch mask to define a protrusion under the hard mask pattern, the lower mold layer including the protrusion and an etched top surface located at a lower level than a top surface of the protrusion;
    forming a support layer on the substrate having the protrusion;
    planarizing the support layer until the top surface of the protrusion is exposed, thereby forming a support pattern; and
    forming a lower electrode contacting the support pattern and being supported by the support pattern.

14. The method as claimed in claim 13, wherein the forming of the lower electrode includes:
    forming an upper mold layer on the protrusion and the support pattern;
    forming an electrode hole successively penetrating the upper mold layer and the lower mold layer and exposing at least a portion of a sidewall of the support pattern adjacent to the protrusion;
    sequentially forming a lower electrode layer and a filling layer on the substrate having the electrode hole;
    planarizing the filing layer and the lower electrode layer to form a lower electrode and a filling pattern in the electrode hole; and
    removing the filling pattern, the upper mold layer and the lower mold layer.

15. A method of fabricating a semiconductor memory device, the method comprising:
    forming a lower mold layer on a substrate, the lower mold layer including a plurality of spaced apart protrusions;
    forming a support layer on the substrate having the protrusions;
    planarizing the support layer until top surfaces of the protrusions are exposed, thereby forming a support pattern between the protrusions;
    forming an upper mold layer on the protrusions and the support pattern;
    forming electrode holes successively penetrating the upper mold layer and the lower mold layer and exposing at least a portion of sidewalls of the support pattern adjacent to the protrusions; and
    forming lower electrodes in the electrode holes, the lower electrodes contacting the support pattern and being supported by the support pattern.

16. The method as claimed in claim 15, wherein the plurality of spaced apart protrusions of the lower mold layer are formed by:
    forming a guide layer having spaced apart guide-openings on the lower mold layer;
    forming a hard mask layer filling the spaced apart guide-openings;
    planarizing the hard mask layer until the guide layer is exposed, thereby forming a hard mask pattern in the spaced apart guide-openings;
    etching the guide layer and the lower mold layer using the hard mask pattern as an etch mask to define the spaced apart protrusions under the hard mask pattern, the lower mold layer including the spaced apart protrusions and an etched top surface located at a lower level than a top surface of the spaced apart protrusions.

17. The method as claimed in claim 15, wherein the forming of the lower electrodes includes:
    sequentially forming a lower electrode layer and a filling layer on the substrate having the electrode holes;
    planarizing the filing layer and the lower electrode layer to form lower electrode and filling patterns in the electrode holes; and
    removing the filling patterns, the upper mold layer and the lower mold layer.

18. The method as claimed in claim 1, comprising forming the hard mask pattern directly on the lower mold layer in a region where the protrusion is defined.

19. The method as claimed in claim 1, wherein the protrusion consists of a material of which the lower mold layer is formed.

20. The method as claimed in claim 1, comprising forming the lower electrode after etching the lower mold layer using the hard mask pattern as an etch mask to form an etched lower mold layer and to define a protrusion under the hard mask pattern.

* * * * *